US009136831B2

(12) United States Patent  
Santosh Kumar et al.

(10) Patent No.: US 9,136,831 B2  
(45) Date of Patent: Sep. 15, 2015

(54) FREQUENCY TO VOLTAGE CONVERTER

(75) Inventors: Gowdhaman Santosh Kumar, Mumbai (IN); Shojaei Baghini Maryam, Mumbai (IN); Anavangot Vineeth, Mumbai (IN); Mukherjee Jayanta, Mumbai (IN)

(73) Assignee: INDIA INSTITUTE OF TECHNOLOGY, BOMBAY, Mumbai, Maharashtra (IN)

( * ) Notice: Subject to any disclaimer, the term of this patent is extended or adjusted under 35 U.S.C. 154(b) by 0 days.

(21) Appl. No.: 14/111,874

(22) PCT Filed: Jul. 5, 2012

(86) PCT No.: PCT/IN2012/000475  
§ 371 (c)(1),  
(2), (4) Date: Oct. 15, 2013

(87) PCT Pub. No.: WO2013/051022  
PCT Pub. Date: Apr. 11, 2013

(65) Prior Publication Data  
US 2014/0225650 A1  Aug. 14, 2014

(30) Foreign Application Priority Data  
Jul. 5, 2011 (IN) .......................... 1936/MUM/2011

(51) Int. Cl.  
*H03D 3/00* (2006.01)  
*H03K 9/06* (2006.01)  
*G01R 23/06* (2006.01)

(52) U.S. Cl.  
CPC . *H03K 9/06* (2013.01); *G01R 23/06* (2013.01)

(58) Field of Classification Search  
CPC ........................................................ H03K 9/06  
USPC ........... 327/532, 537–543, 100–333; 323/315  
See application file for complete search history.

(56) References Cited

U.S. PATENT DOCUMENTS

| 3,473,048 A | 10/1969 | Winn |
| 3,697,781 A | 10/1972 | McLean |
| 3,965,877 A | 6/1976 | Adey |

(Continued)

OTHER PUBLICATIONS

United States Patent and Trademark Office, "International Search Report", U.S., Apr. 2, 2013.  
United States Patent and Trademark Office (ISA/US), "Written Opinion of the International Searching Authority", for International application No. PCT/IN2012/000475 filed on Jul. 5, 2012, Date of mailing as of Apr. 2, 2013.

(Continued)

*Primary Examiner* — Brandon S Cole  
*Assistant Examiner* — Metasebia Retebo  
(74) *Attorney, Agent, or Firm* — Tim Tingkang Xia, Esq.; Locke Lord LLP

(57) ABSTRACT

According to the invention, there is provided a frequency to voltage converter for generating an output voltage proportional to the frequency of input signal. It comprises a switched capacitor circuit for receiving input signal and generating an input current proportional to said frequency, the switched capacitor having a capacitor charging and discharging at said frequency; an operational transconductance amplifier (OTA) for receiving at least one control voltage representative of the input current and generating current proportional to the at least one control voltage; at least one negative feedback circuit connecting input and output of the OTA, each negative feedback circuit comprising: a control transistor coupled to a node of the OTA; a diode connected transistor coupled to the control transistor for sensing current flowing through the control transistor; and a feedback transistor coupled to another node of the OTA.

10 Claims, 2 Drawing Sheets

(56) References Cited

U.S. PATENT DOCUMENTS

Figure 1:
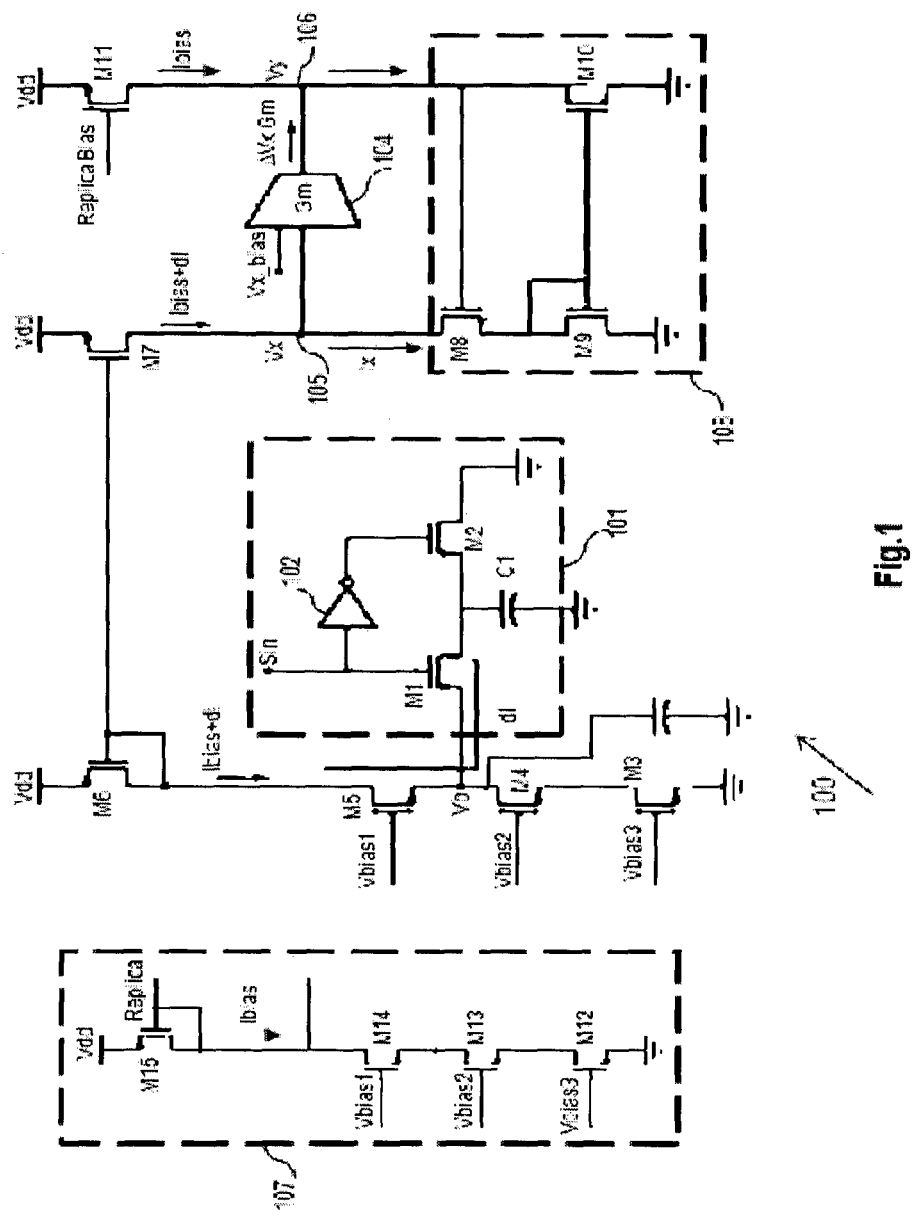

| | | | |
|---|---|---|---|
| 4,491,010 A | | 1/1985 | Brandt et al. |
| 4,496,858 A | | 1/1985 | Smith |
| 5,719,523 A | * | 2/1998 | Schlig .......................... 327/543 |
| 5,955,903 A | | 9/1999 | Pham |
| 2003/0030482 A1 | * | 2/2003 | Mori ............................ 327/540 |

OTHER PUBLICATIONS

The International Bureau of WIPO, "International Preliminary Report on Patentability", for International application No. PCT/IN2012/000475 filed on Jul. 5, 2012, Date of issuance as of Jan. 7, 2014.

* cited by examiner

FREQUENCY TO VOLTAGE CONVERTER

FIELD OF THE INVENTION

This invention relates to a frequency to voltage converter. More specifically, the present invention relates to a linear and highly sensitive frequency to voltage converter.

BACKGROUND OF THE INVENTION

Frequency to voltage converters are required to perform linear, low-distortion and highly sensitive conversion of frequency to voltage. Conventionally, many kinds of frequency to voltage converters are available.

One kind of frequency to voltage converter is disclosed in U.S. Pat. No. 3,784,845, which includes a squaring amplifier responsive to an applied input frequency signal for producing constant amplitude square waves at the input frequency. A first capacitor is rapidly charged from a reference voltage and a voltage due to an accumulated charge on a second capacitor during the first half cycle of each square wave. The charge accumulated on the first capacitor is rapidly transferred to the second capacitor during the second half cycle of each square wave. The voltage due to the accumulated charge on the second capacitor is coupled to a buffer amplifier through a long time constant integrating filter whereby the amplifier provides an output D.C. voltage which is linearly proportional to the frequency of the input signal. However, the output DC voltage is proportional to the input frequency only when the discharging time constant of the second capacitor is large compared to an internal time constant.

Another type of frequency to voltage converter is a PLL-based frequency demodulator. Though PLL-based demodulators can ensure linear conversion of frequency to voltage once PLL is locked, the lock range of PLL is determined by the loop bandwidth. In order to attain good tracking characteristics by reducing transient error of input modulated wave and to reduce the jitter in the output due to internal VCO noise, the loop bandwidth should be more compared to modulation bandwidth. However, when C/N ratio of the input signal is inferior, the loop bandwidth has to be kept minimum in order to reduce the jitter at the output. Therefore, it is difficult to attain both good tracking characteristics and a low-distortion demodulation of input frequency signals using above mentioned PLL-based frequency demodulator.

Yet another type of frequency to voltage converter is disclosed in U.S. Pat. No. 4,479,091 titled as Phase locked loop FM demodulator with variable bandwidth loop filter. In said document, the loop bandwidth is varied by a control voltage generated from a signal proportional to modulation index and a signal proportional to noise. Hence linear demodulation is made possible even in the presence of external noise. However, the range through which the bandwidth is varied is limited as the loop bandwidth is controlled by the channel resistance of JFET which saturates beyond pinch off. Moreover multiple feedback loops are required.

Yet another kind of frequency to voltage converter is available which facilitate conversion of frequency to current and then current to voltage using a resistive load. In the design of linear integrated circuits of such frequency to voltage converters, it is desirable to have an electrical resistance load element which is linear, that is, where the current through the load is linearly proportional to the voltage across the load over a reasonably wide operating range of voltage. However, using such a load consumes an inordinately large amount of semiconductor silicon wafer area. On the other hand, use of source to drain resistance of an insulated gate metal oxide semiconductor field effect transistor (IGFET or MOSFET) as a load enables more compact implementation of such a load but only at the expense of non-linearity over desired operating parameters.

Hence, there is a need for a frequency to voltage converter designed using CMOS technology which facilitates linear, low-distortion conversion of frequency to voltage and is also capable of detecting input signals of low frequency deviations.

DETAILED DESCRIPTION OF THE EMBODIMENTS OF THE INVENTION

Various embodiments of the present invention provide a frequency to voltage converter for generating an output voltage proportional to the frequency of an applied input signal. The frequency to voltage converter comprises a switched capacitor circuit for receiving the applied input signal and generating an input current proportional to said frequency, the switched capacitor having a capacitor charging and discharging at said frequency; an operational transconductance amplifier (OTA) for receiving at least one control voltage representative of the input current and generating current proportional to the at least one control voltage; and at least one negative feedback circuit connecting input and output of the OTA, each negative feedback circuit comprising: a control transistor coupled to a node of the OTA; a diode connected transistor coupled to the control transistor for sensing current flowing through the control transistor; and a feedback transistor coupled to another node of the OTA, also coupled to the diode connected transistor in a current mirror configuration for mirroring current flowing through the diode connected transistor, and further coupled to a control terminal of the control transistor for varying current through the control transistor till an equivalence is established between the input current and currents through the control, diode-connected and feedback transistors and a voltage at the output of the OTA is proportional to the input current.

Preferably, the switched capacitor circuit comprises a capacitor and a pair of transistors coupled to the capacitor, the pair of transistors acting as switches for charging and discharging the capacitor at the frequency of the applied input signal.

Preferably, the OTA has a differential input and a single ended output, receives a control voltage representative of the input current at an input and generates a current proportional to the control voltage at the single ended output, and has a negative feedback circuit connected between said input and the single ended output.

Preferably, in the negative feedback circuit, the control transistor has a drain terminal which is coupled to said input and receives the input current from the switched capacitor circuit for establishing the control voltage at said input, has a source terminal coupled to a drain terminal of the diode connected transistor, and have a gate terminal coupled to a drain terminal of the feedback transistor, and the feedback transistor has a drain terminal coupled to the single-ended output of the OTA.

Preferably, the control transistor has a drain terminal coupled to the switched capacitor circuit via a current mirror circuit.

Preferably, the OTA has a differential first and second input and a differential first and second output, a first negative feedback circuit connecting the first input and first output and a second negative feedback circuit connecting the second input and second output, and receiving a control voltage representative of an input current of positive polarity at the first input and a control voltage representative of an input current of the negative polarity at the second input, and generating a current at each of the first and second outputs, wherein difference of output currents being proportional to difference of the input control voltages.

Preferably, in each of the first and second negative feedback circuits, the control transistor has a drain terminal coupled to respective output of the OTA, has a source terminal connected to a drain terminal of the diode connected transistor, and has a gate terminal coupled to a drain terminal of the feedback transistor, and the feedback transistor has a drain terminal which is coupled to respective input of the OTA and receives the input current of positive/negative polarity for establishing the control voltage at respective input of the OTA.

Preferably, in steady state operation, the difference between voltages appearing at the first and second outputs is proportional to the input current.

Preferably, the feedback transistor of the first negative feedback circuit has a drain terminal coupled to the switched capacitor circuit via a current mirror circuit.

Preferably, the feedback transistor of the second negative feedback circuit has a drain terminal coupled to the switched capacitor circuit via a negative polarity current generator.

Figure 2:
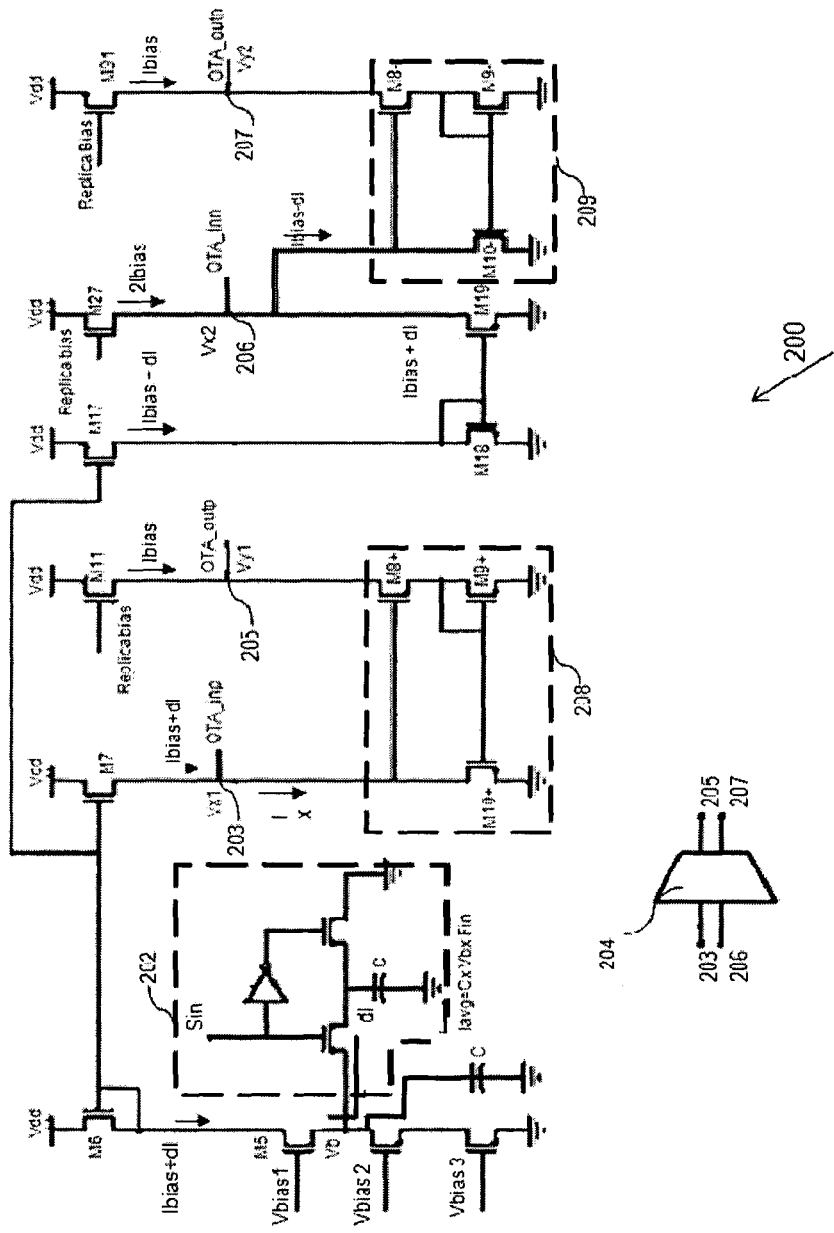

These and other aspects, features and advantages of the invention will be better understood with reference to the following detailed description, accompanying drawings and appended claims, in which, FIG. 1 illustrates a frequency to voltage converter implementing an operational transconductance amplifier (OTA) in accordance with an embodiment of the present invention; and FIG. 2 illustrates a frequency to voltage converter implementing a fully differential OTA in accordance with another embodiment of the present invention.

Referring now to figures and more particularly to FIG. 1 which illustrates a frequency to voltage converter 100 for generating an output voltage $V_y$ proportional to frequency of an applied input signal $S_{in}$. The frequency to voltage converter 100 comprises a switched capacitor circuit 101 for receiving the input signal $S_{in}$ and generating a variable current dI proportional to frequency of the input signal $S_{in}$.

The switched capacitor circuit 101 comprises an inverter 102, transistors $M_1$ and $M_2$ and a capacitor $C_1$. The transistors $M_1$ and $M_2$ act as switches that charge and discharge the capacitor $C_1$ at the frequency of the input signal $S_{in}$.

The switched capacitor circuit 101 is coupled to ground via transistors $M_3$ and $M_4$ and to a power supply terminal $V_{dd}$ via transistors $M_5$ and $M_6$. As illustrated in the figure, bias voltages are provided to the gates of the transistors $M_3$, $M_4$ and $M_5$ so that a bias current $I_{bias}$ flows through the transistors $M_3$ and $M_4$ and a current $I_{bias}$+dI flows through the transistors $M_5$ and $M_6$. It may be noted that the transistor $M_5$ acts as a common-gate amplifier and the average switching current $I_{avg}$ flowing through the transistor $M_5$ can be obtained by equation $C*V_b*f_{in}$, where C is the capacitance of the capacitor $C_1$, $V_b$ is average voltage appearing between drain of $M_4$ and ground and $f_{in}$ is average frequency of the input signal $S_{in}$.

Additionally, a high capacitance $C_b$ may be provided between the voltage node $V_b$ and ground to remove the high frequency components from the instantaneous current when the input frequency is low. The capacitor $C_b$ performs the averaging action on the instantaneous current through the switched capacitor circuit 101. When the input frequency is high, then the parasitic capacitance of $M_3$ and $M_4$ will serve the above purpose, and no explicit capacitance $C_b$ is required.

The transistor $M_6$ have a source terminal coupled to the voltage supply terminal $V_{dd}$, a drain terminal coupled to drain of transistor $M_5$, and a gate terminal coupled to gate of the transistor $M_7$ in a current mirror configuration. The current flowing through the transistor $M_6$ is mirrored by the transistor $M_7$ such that any time the current flowing through the transistor $M_7$ is $I_{bias}$ dI.

The frequency to voltage converter 100 further comprises an Operational Transconductance Amplifier (OTA) 104 having a transconductance of value $G_m$.

The OTA 104 has, an input node 105 and a single-ended output node 106. A negative feedback circuit 108 is connected between the input node 105 and the single-ended output node 106. The negative feedback circuit 108 comprises a control transistor $M_8$ coupled to the input node 105, a diode connected transistor $M_9$ coupled to the control transistor $M_8$ and a feedback transistor $M_{10}$ coupled to the single-ended output node 106. The feedback transistor $M_{10}$ is coupled to the diode connected transistor $M_9$ in a current mirror configuration and, further coupled to a control terminal of the control transistor $M_8$.

In the negative feedback circuit 108, the control transistor $M_8$ has a drain terminal which is coupled to the input node 105 and receives the input current $I_{bias}$+dI, a source terminal coupled to drain terminal of the diode-connected transistor $M_9$, and a gate terminal coupled to a drain terminal of the feedback transistor $M_{10}$. The gate terminal of the diode connected transistor $M_9$ is connected to the gate of the feedback transistor $M_{10}$, and the drain terminal of the feedback transistor $M_{10}$ is coupled to the single-ended output node 106.

As illustrated in the figure, the input node 105 is coupled to the drain of the transistor $M_7$ for receiving the input current $I_{bias}$+dI and is coupled to the ground via the control transistor $M_8$ and the diode connected transistor $M_9$. Further, the single-ended output node 106 is coupled to a power supply terminal $V_{dd}$ via a transistor $M_{11}$ and to the ground via the feedback transistor $M_{10}$. A bias current $I_{bias}$ flows through the transistor $M_{11}$ due to coupling of the gate of the transistor $M_{11}$ to a replica bias circuit 107.

Preferably, the transistors M1-M15 are Metal-oxide Semiconductor Field-effect transistors (MOSFETs) or any other transistor of similar nature.

Operationally, a control voltage $V_x$ representative of the input current $I_{bias}$+dI appears at the input node 105 due to flow of current $I_x$ through transistors $M_8$ and $M_9$. The control voltage $V_x$ is represented by the following equation:

$$V_x = V_{x\_bias} + \Delta V_x$$

where $V_{x\_bias}$ component is contributed by the bias current $I_{bias}$ and $\Delta V_x$ component is contributed by the variable current dI. $V_x$ is dependent on the frequency $f_{in}$ of the input signal $S_{in}$, because as $f_{in}$ increases, the input current $I_{bias}$+dI increases and increases control voltage $V_x$. It may be noted that the control voltage $V_x$ is representative of the input current $I_{bias}$+dI but not necessarily be proportional to it due to non-linear characteristics of the transistors $M_8$, $M_9$ and $M_{10}$.

The OTA 104 receives the control voltage $V_x$ at one input (negative terminal) and voltage $V_{x\_bias}$ at another input (positive terminal) for generating a current $\Delta V_x G_m$ proportional to the control voltage $V_x$, thus resulting in flow of OTA generated current $\Delta V_x G_m$ and the bias current $I_{bias}$ through the feedback transistor $M_{10}$.

Further, the current $I_x$ flowing through the control transistor $M_8$ is sensed by the diode-connected transistor $M_9$ and is mirrored by the feedback transistor $M_{10}$, such that the current $I_x$ also flows through the feedback transistor $M_{10}$. Any difference between the current $I_x$ and $I_{bias}$+$\Delta V_x G_m$ through the feedback transistor $M_{10}$ causes the voltage $V_y$ at the single-ended output node 106 to vary, which in turn varies the current through $M_8$ till it become equals to the OTA generated current $I_{bias}+\Delta V_x G_m$.

In steady state condition, the input current $I_{bias}+dI$, and the currents through $M_8$, $M_9$ and $M_{10}$ become equal to each other, and the voltage $V_y$ is proportional to the input current $I_{bias}+dI$. The linearity of the transistors $M_8$, $M_9$, and $M_{10}$ is limited by the linearity of the OTA 104 as they track the I-V characteristics of the OTA 104. Thus, the resistance provided by $M_8$, $M_9$, and $M_{10}$ is reciprocal of the transconductance $G_m$. However, the transconductance $G_m$ of the OTA 104 is very small, i.e. in the order of nanoampere/volt, therefore, the resistance of $M_8$, $M_9$, and $M_{10}$ is of quite high value, leading to high sensitivity conversion of the input current $I_{bias}+dI$ to the output voltage $V_y$.

FIG. 2 illustrates a frequency to voltage converter 200 implementing a fully differential OTA in accordance with another embodiment of the present invention. The frequency to voltage converter 200 comprises a switched capacitor circuit 202 for receiving the input signal $S_{in}$ and generating a variable current dI proportional to frequency of the input signal $S_{in}$.

The construction and operation of the switched capacitor circuit 202 is not described here as it is similar to the above-mentioned switched capacitor circuit 101.

The frequency to voltage converter 200 comprises a fully differential Operational Transconductance Amplifier (OTA) 204 having a transconductance of value $G_m$. The differential OTA 204 has a differential input and a differential output, such that it has a first input node 203, a first output node 205, a second input node 206, and a second output node 207.

A first negative feedback circuit 208 is connected between the first input node 203 and the first output node 205. Further, a second negative feedback circuit 209 is connected between the second input node 206 and the second input node 207.

The first negative feedback circuit 208 receives an input current of positive polarity, i.e. $I_{bias}$ dI from the transistor $M_6$ through a current mirror configuration of transistors $M_6$ and $M_7$.

On the other hand, the second negative feedback circuit 209 receives an input current of negative polarity i.e. $I_{bias}-dI$ from the transistor $M_6$ through a negative polarity current generator made of transistors $M_{17}$, $M_{18}$, $M_{19}$ and $M_{27}$. For generating the input current of negative polarity $I_{bias}-dI$, the input current $I_{bias}+dI$ is mirrored by the transistor $M_{17}$, which is then sensed by the transistor $M_{18}$ and further mirrored by the transistor $M_{19}$. A replica bias circuit is connected to the gate of the transistor $M_{27}$ so as to generate a bias current of $2I_{bias}$ through the transistor $M_{27}$ and thus generating $I_{bias}-dI$ current for the second negative feedback circuit 209.

Each of the first and second feedback circuits 208 and 209 comprises a control transistor $M_{8+}/M_{8-}$ having a drain coupled to respective output node, a diode-connected transistor $M_{9+}/M_{9-}$ having a drain coupled to the source of the control transistor $M_{8+}/M_{8-}$ and further coupled to a feedback transistor $M_{10+}/M_{10-}$ in a current mirror configuration. The feedback transistor $M_{10+}/M_{10-}$ has a drain coupled to respective input node and also to gate terminal of the respective control transistor $M_{8+}/M_{8-}$. Essentially, each of the first and second negative feedback circuits 208 and 209 is obtained by flipping the negative feedback circuit 108 around the OTA 204. The output DC bias of the OTA 204 is set by a CMFB circuit present inside the OTA 204.

Operationally, a control voltage $V_{x1}$ representative of the input current of positive polarity $I_{bias}+dI$ appears at the first input node 203. The first input node 203 is biased due to connection to the gate of $M_{8+}$. The voltage $V_{x1}$ is provided by the equation:

$$V_{x1}=V_{x1\_bias}+\Delta V_{x1}$$

Further, a control voltage $V_{x2}$ representative of the input current of negative polarity $I_{bias}-dI$ appears at the second input node 206. The second input node 206 is biased due to connection to the gate of $M_8$. The voltage $V_{x2}$ is provided by the equation:

$$V_{x2}=V_{x2\_bias}-\Delta V_{x2}$$

Assuming that the transistors $M_{8+}$, $M_{9+}$, and $M_{10+}$ are similar to transistors $M_{8-}$, $M_{9-}$ and $M_{10-}$ respectively, the voltage $V_{x1\_bias}$ will also be similar to the voltage $V_{x2\_bias}$.

The OTA 204 receives the control voltage $V_{x1}$ at first input 203 and voltage $V_{x2}$ at second input 206 for generating a current at each output node 205 and 207. The difference between the currents generated at output nodes 205 and 207 is proportional to the difference in the input voltages $V_{x1}$ and $V_{x2}$.

Due to current generated at the output node 205 and the bias current $I_{bias}$, a voltage $V_{y1}$ appears between the drain of $M_{8+}$ and the ground. The current flowing through the control transistor $M_{8+}$ is sensed by the diode-connected transistor $M_{9+}$ and is mirrored by the feedback transistor $M_{10+}$. Any difference between the current $I_{bias}+dI$ and the mirrored current through the feedback transistor $M_{10+}$ causes the voltage $V_{x1}$ at the input node 203 to vary, which in turn varies the current through $M_{8+}$ till an equivalence is established between the current $I_{bias}+dI$, and currents through $M_{8+}$ $M_{9+}$, and $M_{10+}$.

Similarly, due to current generated at the output node 207 and the bias current $I_{bias}$, a voltage $V_{y2}$ appears between the drain of $M_{8-}$ and the ground. The current flowing through the control transistor $M_{8-}$ is sensed by the diode-connected transistor $M_{9-}$ and is mirrored by the feedback transistor $M_{10-}$. Any difference between the current $I_{bias}-dI$ and the mirrored current through the feedback transistor $M_{10-}$ causes the voltage $V_{x2}$ at the input node 206 to vary, which in turn varies the current through $M_{8-}$ till an equivalence is established between the current $I_{bias}-dI$, and currents through $M_{8-}$, $M_{9-}$ and $M_{10-}$.

In steady state condition, the difference between voltages $V_{y1}$ and $V_{y2}$ is proportional to the current generated by the switched capacitor circuit 202 and thus to the frequency of the input signal $S_{in}$. It may be noted that the use of a fully differential OTA 204 instead of the OTA 104 ensures cancellation of even harmonics and better linear conversion of frequency to voltage.

In various embodiments of the present invention, the frequency to voltage converters 100 and 200 requires very less area and are of smaller size as compared to frequency to voltage converters of passive resistance type. Further, the resistors of frequency to voltage converters 100 and 200 do not require additional MASK layers unlike passive resistors for, implementation in silicon. Both the above-mentioned factors lead to low design cost.

In addition, the resistors of the frequency to voltage converters 100 and 200 require a lower voltage headroom compared to similar value passive resistors. Low voltage designs are critical for sub nanometer CMOS Designs.

The frequency to voltage converters 100 and 200 may be very useful in biotelemetry applications, where they can be used as highly sensitive frequency demodulators for demodulating input signals of frequency deviation of the order of few khz.

Although the invention has been described with reference to a specific embodiment, this description is not meant to be construed in a limiting sense. Various modifications of the disclosed embodiment, as well as alternate embodiments of the invention, will become apparent to persons skilled in the art upon reference to the description of the invention. It is therefore contemplated that such modifications can be made without departing from the scope of the invention as defined in the appended claims.

The invention claimed is:

1. A frequency to voltage converter for generating an output voltage proportional to the frequency of an applied input signal comprising:
   a switched capacitor circuit for receiving the applied input signal and generating an input current proportional to said frequency, the switched capacitor having a capacitor charging and discharging at said frequency;
   an operational transconductance amplifier (OTA) for receiving at least one control voltage representative of the input current and generating current proportional to the at least one control voltage; and
   at least one negative feedback circuit connecting an input node and an output node of the OTA, each negative feedback circuit comprising:
      a control transistor having a drain terminal coupled to the input node of the OTA, a source terminal, and a gate terminal coupled to the output node of the OTA;
      a diode connected transistor having a drain terminal coupled to the source terminal of the control transistor for sensing current flowing through the control transistor, a source terminal grounded, and a gate terminal; and
      a feedback transistor having a drain terminal coupled to the output node of the OTA, a source terminal grounded, and a gate terminal coupled to the gate terminal of the diode connected transistor in a current mirror configuration for mirroring current flowing through the diode connected transistor, and wherein the drain terminal of the feedback transistor is further coupled to the gate terminal of the control transistor for varying current through the control transistor till an equivalence is established between the input current and currents through the control, diode-connected and feedback transistors and a voltage at the output node of the OTA is proportional to the input current.

2. The frequency to voltage converter as claimed in claim 1, wherein the switched capacitor circuit further comprises a pair of transistors coupled to the capacitor, the pair of transistors acting as switches for charging and discharging the capacitor at the frequency of the applied input signal.

3. The frequency to voltage converter as claimed in claim 1, wherein the OTA has a differential input and a single ended output, receives a control voltage representative of the input current at an input and generates a current proportional to the control voltage at the single ended output.

4. The frequency to voltage converter as claimed in claim 3, wherein in the negative feedback circuit, the control transistor receives the input current from the switched capacitor circuit for establishing the control voltage at said input.

5. The frequency to voltage converter as claimed in claim 4, wherein the control transistor has the drain terminal coupled to the switched capacitor circuit via a current mirror circuit.

6. The frequency to voltage converter as claimed in claim 1, wherein the OTA has a differential first and second input and a differential first and second output, a first negative feedback circuit connecting the first input and first output and a second negative feedback circuit connecting the second input and second output, and receiving a control voltage representative of an input current of positive polarity at the first input and a control voltage representative of an input current of the negative polarity at the second input, and generating a current at each of the first and second outputs, wherein difference of output currents being proportional to difference of the input control voltages.

7. The frequency to voltage converter as claimed in claim 6, wherein in each of the first and second negative feedback circuits, the control transistor has a drain terminal coupled to respective output of the OTA, has a source terminal connected to a drain terminal of the diode connected transistor, and has a gate terminal coupled to a drain terminal of the feedback transistor, and the feedback transistor has a drain terminal which is coupled to respective input of the OTA and receives the input current of positive/negative polarity for establishing the control voltage at respective input of the OTA.

8. The frequency to voltage converter as claimed in claim 7, wherein in steady state operation, the difference between voltages appearing at the first and second outputs is proportional to the input current.

9. The frequency to voltage converter as claimed in claim 7, wherein the feedback transistor of the first negative feedback circuit has a drain terminal coupled to the switched capacitor circuit via a current mirror circuit.

10. The frequency to voltage converter as claimed in claim 7, wherein the feedback transistor of the second negative feedback circuit has a drain terminal coupled to the switched capacitor circuit via a negative polarity current generator.

* * * * *